United States Patent
Schneider et al.

(10) Patent No.: US 7,449,925 B2
(45) Date of Patent: Nov. 11, 2008

(54) METHOD FOR INITIALIZATION OF ELECTRONIC CIRCUIT UNITS, AND ELECTRIC CIRCUIT

(75) Inventors: Ralf Schneider, Munich (DE); Markus Krach, Freising (DE); Jorg Vollrath, Olching (DE); Gheorghe Dumitras, Munich (DE)

(73) Assignee: Infineon Technologies AG, Munich (DE)

( * ) Notice: Subject to any disclaimer, the term of this patent is extended or adjusted under 35 U.S.C. 154(b) by 293 days.

(21) Appl. No.: 11/392,522

(22) Filed: Mar. 29, 2006

(65) Prior Publication Data
US 2006/0219798 A1   Oct. 5, 2006

(30) Foreign Application Priority Data
Mar. 31, 2005   (DE)   .................. 10 2005 014 723

(51) Int. Cl.
*H03L 7/00* (2006.01)
(52) U.S. Cl. ...................... 327/142; 327/143
(58) Field of Classification Search ......... 327/142–143, 327/198; 235/492
See application file for complete search history.

(56) References Cited

U.S. PATENT DOCUMENTS 5,450,085 A * 9/1995 Stewart et al. ............... 341/159
6,192,429 B1   2/2001 Jeong et al.
6,868,501 B2 * 3/2005 Saitou et al. ................ 713/330
7,095,216 B2 * 8/2006 Matsuo et al. .............. 323/267
7,102,395 B2 * 9/2006 Saito ........................... 327/74

FOREIGN PATENT DOCUMENTS

DE   10019479   10/2001

OTHER PUBLICATIONS

German Office Action dated Nov. 25, 2005.

* cited by examiner

*Primary Examiner*—Dinh T. Le
(74) *Attorney, Agent, or Firm*—Patterson & Sheridan, L.L.P.

(57) ABSTRACT

In a method for initializing at least one electronic circuit unit of an electric circuit, a supply voltage is applied to a power supply connection unit of the electronic circuit in order to supply electrical power to the electronic circuit unit. A reference signal is applied to the electronic circuit unit via a reference signal connection unit. A blocking unit connected to the reference signal connection unit blocks the electronic circuit unit until the reference signal is supplied. An input signal to the electronic circuit unit is supplied via an input signal connection unit of the electronic circuit and an output signal is output by an output signal connection unit of the electronic circuit. The output signal is dependent on the input signal and the reference signal supplied to the electronic circuit unit.

10 Claims, 2 Drawing Sheets

LEGEND 101a, 101b, 101c, ... - ELECTRONIC CIRCUIT UNITS

103 - COMPARISON UNIT

105 - ACTIVATION SIGNAL PRODUCTION UNIT

108 - VOLTAGE DIVIDER UNIT

METHOD FOR INITIALIZATION OF ELECTRONIC CIRCUIT UNITS, AND ELECTRIC CIRCUIT

BACKGROUND OF THE INVENTION

1. Field of the Invention

The present invention relates in general to a method for initialization of electronic circuit units which are arranged in a circuit apparatus, and to a corresponding circuit apparatus for carrying out the method, and relates in particular to a method which provides initialization of electronic circuit units while avoiding faults resulting from reference voltages which are not present.

2. Description of the Prior Art

Electronic circuit units, such as an SDRAM module, must not accept any commands during initialization until a so-called reference voltage is applied, with which an input signal is compared, for example for digitization purposes. According to the JEDEC specification (JESD 79 D), initialization of, for example, a DDR-SDRAM module must satisfy particular predetermined conditions. These include in particular "power-up" and initialization such that undefined operation is avoided.

Furthermore, from the initialization viewpoint, it is not expedient to permit a typical total time period of 10 milliseconds (ms) in accordance with the abovementioned specification for initialization. For future generations of electronic circuit units such as these, time periods such as these are longer and it must be considered, furthermore, that the various voltages, such as the operating voltage VDD and the reference voltage $V_{ref}$ are provided by the use of different power supply units, rather than by supplying them from a single, common voltage source.

The signals at the inputs of the electronic circuit unit, which is in the form of an SDRAM, are normally related to the reference voltage $V_{ref}$ that is supplied. During initialization, that is to say while $V_{ref}$ is still zero and until $V_{ref}$ has reached its final value, with the operating voltage VDD being applied, noise signals at the command inputs (instruction inputs) can disadvantageously lead to noise signals such as these being interpreted by the electronic circuit unit as command signals (instruction signals), and can thus result in a malfunction of the electronic circuit unit in a manner which is not expedient. A further disadvantage is that, in principle, a plurality of command sequences (instruction sequences) can be carried out in the abovementioned initialization time of 10 milliseconds (ms).

According to the stipulations in the JEDEC specification mentioned above, the input signals must, however, be ignored during initialization of the electronic module (of the electronic circuit unit) until the predetermined reference voltage $V_{ref}$ is applied.

In particular, it is not expedient for undefined instruction sequences at the input of the electronic circuit unit or noise signals which are applied to the input of the electronic circuit unit during an initialization mode to be able to lead to the electronic circuit unit (for example the SDRAM module) being unintentionally set to a test mode which changes the function of the electronic circuit unit, for example the function of the memory unit. Another problem is that, during an initialization phase, it is possible for driver devices to cause a short circuit on the board as a result of the provision of output signals from the electronic circuit unit, which are passed on to the driver devices.

FIG. 2 shows a conventional electronic circuit apparatus which, for example, comprises three electronic circuit units. The electronic circuit units which are illustrated in FIG. 2 are referred to as an OCD (OCD=off-chip driver, output driver), a receiver, which corresponds to a receiving unit, and a decoder. When input signals are supplied to an electronic circuit unit, for example in the central electronic circuit unit ("receiver"), then these input signals $V_{in}$ are supplied to an input signal connection E.

The input signals $V_{in}$ are evaluated in the receiver with respect to a reference signal $V_{ref}$ which is supplied to a reference signal connection V. The output signal $V_{out}$ which is emitted from an output signal connection A is emitted from the electronic circuit unit, that is to say the output driver ("OCD") as a function of the input and reference signals $V_{in}$ and $V_{ref}$, respectively, which are supplied. In the circuit arrangement that is illustrated in FIG. 2, the major disadvantage is that the reference voltage $V_{ref}$ is applied continuously via the reference signal connection V, that is to say even during an initialization phase of the circuit apparatus which comprises the three circuit units OCD, receiver and decoder. This leads in a manner which is not expedient to the possibility of noise signals at an input connection E, for example of the central electronic circuit unit, being able to switch this to an operating mode that is not permissible.

SUMMARY OF THE INVENTION

It is an object of the present invention to provide a method for initialization of electronic circuit units and a corresponding circuit apparatus, which avoid initialization faults and do not require manual intervention by an operator.

The object is achieved in accordance with the invention by means of an electronic device, comprising:

a) at least one electronic circuit unit;
b) a power supply connection unit, to which a supply voltage is applied in order to supply electrical power to the at least one electronic circuit unit;
c) a reference signal connection unit, via which a reference signal is supplied to the electronic circuit unit;
d) an input signal connection unit, via which an input signal is supplied to the at least one electronic circuit unit;
e) an output signal connection unit for outputting an output signal, which is dependent on the input and reference signals supplied to the electronic circuit unit, from the electronic circuit unit; and
f) a blocking unit, which is connected to the reference signal connection unit, for blocking the at least one electronic circuit unit until a predetermined reference signal is supplied.

The object is also achieved in accordance with the invention by means of a method for initialization of at least one electronic circuit unit which is arranged in an electronic circuit apparatus, having the steps of:

a) application of a supply voltage to a power supply connection unit in order to supply electrical power to the at least one electronic circuit unit;
b) supply of a reference signal to the at least one electronic circuit unit via a reference signal connection unit;
c) blocking of the at least one electronic circuit unit until a predetermined reference signal is supplied, by means of a blocking unit which is arranged in the electronic circuit apparatus and is connected to the reference signal
d) supply of an input signal to the at least one electronic circuit unit via an input signal connection unit of the electronic circuit apparatus; and
e) outputting of an output signal, which is dependent on the input and reference signals supplied to the electronic circuit unit from the electronic circuit unit by means of an output signal connection unit of the electronic circuit apparatus.

One major idea of the invention is that the electronic circuit units to be initialized can be deactivated or can be blocked during an initialization phase in such a way that the input signals cannot cause any state changes in the electronic circuit units during the initialization phase.

This may result in the advantage that noise signals and undefined input signals which are supplied to the electronic circuit units cannot, for example, switch the corresponding circuit units to a test mode.

A further advantage of the electronic circuit apparatus according to the invention may be that there is no need for any manual intervention by the user since a blocking unit which is arranged in the electronic circuit apparatus according to the invention and is connected to the reference signal connection unit blocks the electronic circuit units which are arranged in the electronic circuit apparatus until a predetermined or specified reference signal is supplied.

A plurality of reference signal connection units may be provided in order to make it possible to supply different reference signals to different electronic circuit units.

The blocking unit may have a comparison unit, for comparison of the supplied reference signal with a requirement signal, in order to block the at least one electronic circuit unit. The requirement signal and/or the requirement signal level are/is preferably derived from an internal signal in the electronic circuit apparatus.

The blocking unit may have an activation signal production unit, for production of an activation signal, in order to block the at least one electronic circuit unit, in order to make it possible to activate the at least one electronic circuit unit. This means that the electronic circuit apparatus and the method for initialization of at least one electronic circuit unit which is arranged in the electronic circuit apparatus have the capability to ensure that the at least one electronic circuit unit is not switched to an unintended mode during an initialization phase. A further advantage may be that no manual intervention is required by an operator during an initialization phase such as this.

DESCRIPTION OF THE PREFERRED EMBODIMENT

Identical reference symbols denote identical or functionally identical components or steps in the figures.

Figure 1:
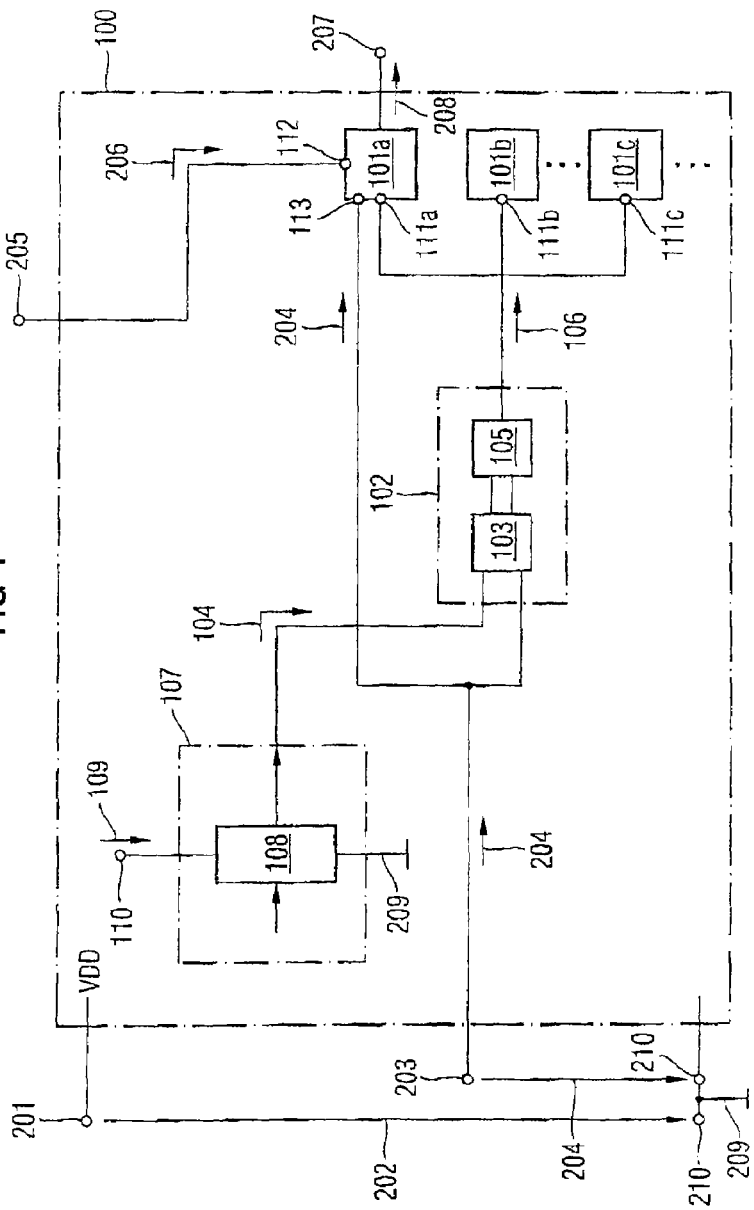
FIG. 1 is a block diagram of an inventive electronic circuit apparatus.
Figure 2:
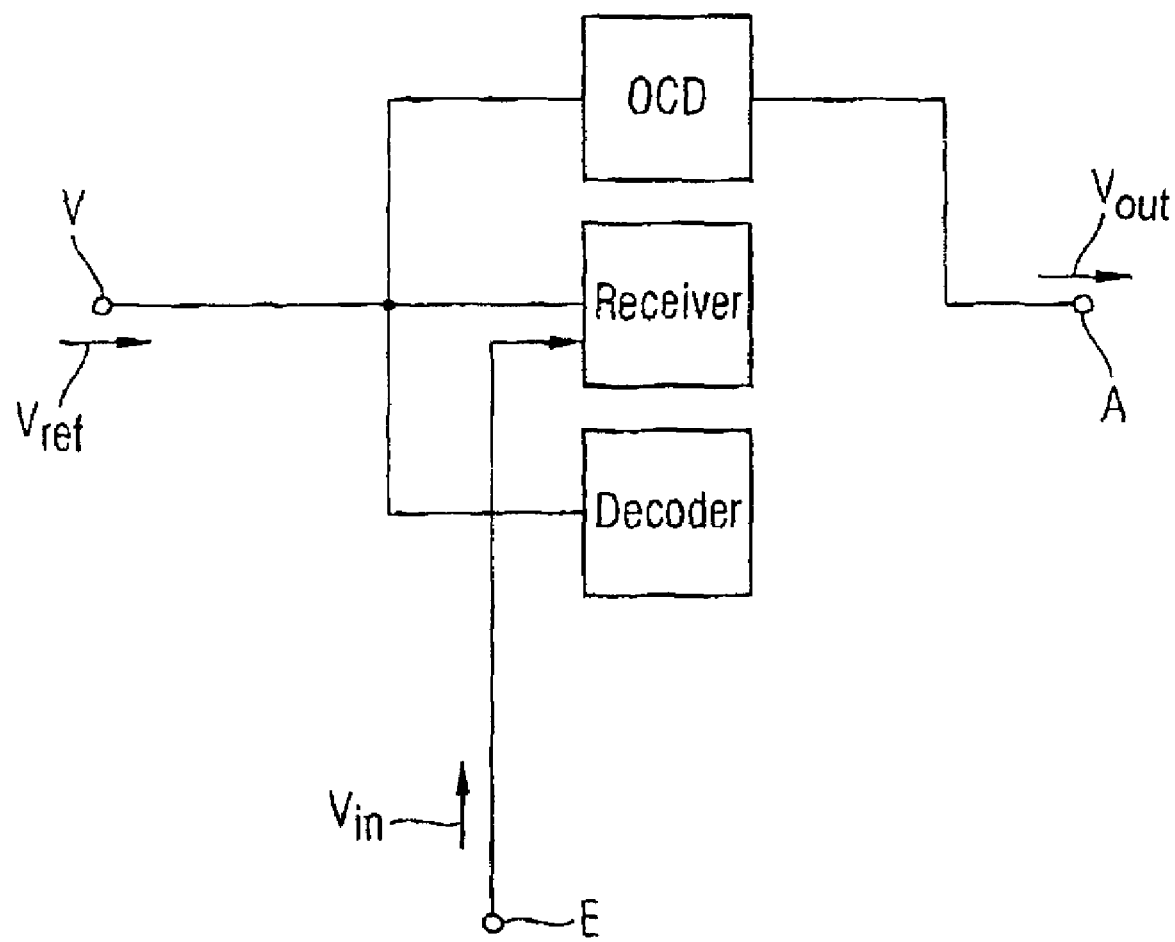
FIG. 2, as discussed above, is an electronic circuit apparatus according to the prior art.

FIG. 1 shows a schematic block diagram of an electronic circuit apparatus 100 according to one preferred exemplary embodiment of the present invention. The fundamental principle of the invention is that the electronic circuit units 101a, 101b and 101c which are arranged in the electronic circuit apparatus 100 can be initialized safely without these electronic circuit units being switched to an unintended operating mode, for example to a test mode.

It should be noted that, in principle, any desired number of electronic circuit units 101a-101n may be arranged in the electronic circuit apparatus 100, depending on the application, although only three electronic circuit units 101a-101c are illustrated in FIG. 1.

The electronic circuit units 101a-101c have respective activation connection units 111a, 111b and 111c, by means of which it is possible to activate the corresponding electronic circuit units 101a, 101b and 101c, respectively, via an activation signal 106 which is supplied. Without this activation signal, the electronic circuit units 101a, 101b and 101c are blocked and cannot, for example, receive any input signals 206, as illustrated with reference to the electronic circuit unit 101a. As has been explained above with reference to the prior art, an electronic circuit unit 101a may, for example, be in the form of a data receiver, in which the input signal 206 can be compared with a reference signal 204. When the reference signal 204 is not applied to the electronic circuit unit 101a, none of the relevant electronic circuit units 101a-101c may, according to the method according to the invention, be active, that is to say the electronic circuit unit 101a to which an input signal 206 is applied in the example illustrated in FIG. 1 must be blocked.

The electronic circuit apparatus 100 essentially has four connection units, that is to say an input signal connection unit 205 for inputting the input signal 206 in the electronic circuit apparatus 100, a power supply connection unit 201 for provision of a power supply for the electronic circuit apparatus 100, a reference signal connection unit 203 for provision of the reference signal 204 for the electronic circuit apparatus 100, and an earth connection unit 210 for definition of the earth 209 for the electronic circuit apparatus 100. A supply voltage 202 is applied between the power supply connection unit 201 and the earth connection unit 210, as the power supply.

The reference signal 204 is applied as a reference signal voltage between the reference signal connection unit 203 and the earth connection unit 210. It should be noted that, even though this is not illustrated in FIG. 1, there may be a plurality of the reference signal connection unit 203 in order to make it possible to supply different reference signals 204 to different electronic circuit units 101a-101n. Furthermore, it is possible for there to be a plurality of input signal connection units 205 in order to make it possible to supply different input signals 206 to different electronic circuit units 101a-101n. This makes it possible to combine different input signals 206 flexibly with different reference signals 204, and to produce appropriate output signals 208 by means of the corresponding electronic circuit unit 101a-101n to which these are applied. A corresponding output signal 208, which in the exemplary embodiment of the present invention as shown in FIG. 1 is obtained from the electronic circuit unit 101a, is emitted from the electronic circuit apparatus 100 via an output signal connection unit 207.

A blocking unit 102 forms the central element of the electronic circuit apparatus according to the invention. The blocking unit 102 is supplied on the one hand with a requirement signal 104 and on the other hand with the reference signal 204. The production of the requirement signal 104 will be explained in the following text with reference to the explanation of a circuit block 107 (requirement signal setting unit). In this context, it should be noted that the requirement signal 104 may, for example, be in the form of a bandgap reference voltage level with which the reference signal 204 or the reference signal level 204 (the voltage difference between the reference signal connection unit 203 and the earth connection unit 210) is compared.

For this purpose, a comparison unit 103 is provided in the blocking unit 102, by means of which a predetermined requirement signal 104 is compared with the reference signal 204. The blocking of the electronic circuit units 101a-101c is canceled only when the reference signal 204 is at a predetermined reference signal level, which is determined with respect to the requirement signal 104 by means of the comparison unit 103. When the reference signal 204 which is supplied to the electronic circuit apparatus 100 via the reference signal connection unit 203 has reached a predetermined level, which is measured in the comparison unit 103 with respect to the level of the requirement signal 104, then an activation signal production unit 105 which is arranged in the blocking unit 102 is actuated, produces the activation signal 106 for activation of the at least one electronic circuit unit 101a-101c, and thus cancels the blocking of the corresponding electronic circuit unit 101a-101c.

This means that malfunctions during an initialization phase of the electronic circuit units 101a-101n are advantageously avoided. All of the input signals which are supplied to the electronic circuit units 101a-101n are expediently blocked during the initialization phase until the level of the reference signal 204 has reached a predetermined level, which is governed by the level of the requirement signal 104. This ensures that input signals 206 (only one input signal is illustrated in FIG. 1 but it should be noted that, in principle, a plurality of different input signals 206 may be provided) are accepted and recognized by the corresponding electronic circuit unit 101a only when the reference signal is correctly applied, irrespective of the magnitude of any noise signals at the individual inputs, that is to say the corresponding useful signal input 112 of the electronic circuit unit 101a, and independently of how long the initialization or the power-up of the individual voltage levels which must be supplied to the electronic circuit unit 101a-101c and the electronic circuit apparatus 100 as an entity lasts.

It should be noted that the electronic circuit units 101a-101n which are provided in the electronic circuit apparatus 100 and are protected by the method according to the invention during an initialization phase may, for example but not necessarily exclusively, be in the form of data current receivers, OCD circuit units (OCD=off-chip driver, output driver unit) and/or decoder units.

The production of the requirement signal 104 which is supplied to the comparison unit 103 in the blocking unit 102 will be explained in the following text. A reference symbol 107 denotes a requirement signal setting unit, by means of which the requirement signal 104 is produced. For this purpose, the requirement signal setting unit 107 is supplied via a requirement signal reference level connection unit 110 with a requirement signal reference level 109, which is preferably obtained from signals within the electronic circuit apparatus 100 (not shown in FIG. 1). By way of example, a requirement signal reference level 109 is provided as a reference level, and is defined as a voltage difference between the requirement signal reference level connection unit 110 and earth 209. A voltage divider unit 108, which is arranged in the requirement signal setting unit 107, is used to set a predetermined level of the requirement signal 104.

By way of example, the requirement signal reference level 109 may be obtained from a bandgap reference voltage, which is 1.1 V, and is normally temperature-compensated. Finally, an internal voltage such as this can be set to a desired reference value for the requirement signal 104 via the voltage divider unit 108, which is arranged in the requirement signal setting unit 107. Only when the level of the reference signal 204, which is supplied externally via the reference signal connection unit 203, has reached or exceeded this requirement signal 104 are the electronic circuit units 101a-101n and further circuit units (not shown in FIG. 1) which are arranged in the electronic circuit apparatus 100 and were previously blocked activated by means of the activation signal 106, which is emitted from the activation signal production unit 105 in the blocking unit 102.

Although modifications and changes may be suggested by those skilled in the art, it is the intention of the inventors to embody within the patent warranted heron all changes and modifications as reasonably and properly come within the scope of their contribution to the art.

We claim as our invention:

1. An electronic circuit, comprising:
   at least one electronic circuit unit;
   a power supply connection configured to receive a supply voltage in order to supply electrical power to said at least one electronic circuit unit;
   a reference signal connection unit configured to supply a reference signal to said at least one electronic circuit unit;
   an input connection unit configured to receive an input signal for said at least one electronic circuit unit;
   an output connection unit configured to output an output signal being dependent on said input signal and said reference signal supplied to said at least one electronic circuit unit; and
   a blocking unit connected to said reference signal connection unit; said blocking unit blocking said at least one electronic circuit unit until said reference signal is at a predetermined reference signal level.

2. The circuit of claim 1, wherein the at least one electronic circuit unit comprises a plurality of electronic circuit units and further comprising at least one additional reference signal connection unit; wherein each reference signal connection unit is respectively connected to one respective electronic circuit unit and wherein each of said electronic circuit units receives a respective reference signal from the respectively connected reference signal connection unit.

3. The circuit of claim 1, wherein said blocking unit comprises a comparison unit for comparing said reference signal with a requirement signal to determine whether the reference signal is at the predetermined reference signal level.

4. The circuit of claim 3, wherein said requirement signal is derived from an internal signal in said electronic circuit.

5. The circuit of claim 1, wherein said blocking unit comprises an activation signal production unit for generating an activation signal for activating said at least one electronic circuit unit.

6. A method for initializing at least one electronic circuit unit, comprising:
   applying a supply voltage to a power supply connection unit of an electronic circuit in order to supply electrical power to said at least one electronic circuit unit of said electronic circuit;
   supplying a reference signal to said at least one electronic circuit unit via a reference signal connection unit;
   blocking said at least one electronic circuit unit utilizing a blocking unit of said electronic circuit until said reference signal is at a predetermined reference signal level; said blocking unit being connected to said reference signal connection unit;
   supplying an input signal to said at least one electronic circuit unit via an input signal connection unit of said electronic circuit; and
   outputting an output signal by means of an output signal connection unit of said electronic circuit; said output signal being dependent on said input signal and said reference signal supplied to said electronic circuit unit.

7. The method according to claim 6, wherein the at least one electronic circuit units comprises a plurality of electronic circuit units, and further comprising supplying a respective reference signal to each electronic circuit unit.

8. The method of claim 6, further comprising comparing said reference signal with a requirement signal level to determine whether the reference signal is at the predetermined reference signal level utilizing a comparison unit of said blocking unit.

9. The method of claim 8, wherein said requirement signal is derived from an internal signal in said electronic circuit.

10. The method of claim 6, further comprising generating an activation signal for activating said at least one electronic circuit unit; said activation signal being generated by an activation signal production unit of said blocking unit.

* * * * *